(12) United States Patent
An

(10) Patent No.: US 8,566,276 B1
(45) Date of Patent: Oct. 22, 2013

(54) TCAM DEFRAGMENTATION CANDIDATE SEARCH SCHEME

(75) Inventor: Yafan An, Fremont, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 639 days.

(21) Appl. No.: 12/544,082

(22) Filed: Aug. 19, 2009

(51) Int. Cl.
*G06F 7/00* (2006.01)
(52) U.S. Cl.
USPC ............................ 707/608; 707/687; 709/245
(58) Field of Classification Search
USPC ..................... 707/600–704; 370/408; 709/245
See application file for complete search history.

(56) References Cited

U.S. PATENT DOCUMENTS

2002/0131432 A1* 9/2002 Bachmutsky et al. ........ 370/408

OTHER PUBLICATIONS

Office Action from U.S. Appl. No. 12/544,069, dated Aug. 31, 2011, 11 pages.
Pending U.S. Patent Application filed on Aug. 19, 2009 entitled "TCAM Defragmentation for Heterogeneous TCAM Application Support", Yafan AN, 42 pages.

* cited by examiner

*Primary Examiner* — Hung T Vy
*Assistant Examiner* — Tuan-Khanh Phan
(74) *Attorney, Agent, or Firm* — Harrity & Harrity, LLP

(57) ABSTRACT

A network device may include a heterogeneously organized TCAM in which entries for different applications implemented by the network device are stored at arbitrary locations in the TCAM. The TCAM may be programmed to include entries representing a plurality of prefix tree ("trie") data structures used in processing network traffic received by the network device. The TCAM may also include logic to insert an entry in the TCAM based on a defragmentation operation performed on the TCAM in which a candidate entry having a minimum relocation weight is chosen to be relocated as part of the defragmentation operation, where the relocation weight is determined based on trie depths corresponding to entries that occupy the candidate entry before defragmentation.

23 Claims, 14 Drawing Sheets

US 8,566,276 B1

TCAM DEFRAGMENTATION CANDIDATE SEARCH SCHEME

BACKGROUND

Computing and communication networks typically include network devices, such as routers, firewalls, switches or gateways, which transfer or switch data, such as packets, from one or more sources to one or more destinations. A packet is a structure that encapsulates data for transmission through a network based on control information that is stored in a header portion of the packet. Network devices may operate on the packets as the packets traverse the network, such as by forwarding or filtering the packet-based network traffic.

A Ternary Content Addressable Memory (TCAM) is commonly used in network devices and other communication devices for quickly identifying the content within a packet. A network device may support a number of different features, such as a network device that functions as both a router and a firewall or a router capable of routing both Internet protocol, version 4 (IPv4) and IPv6 routing prefixes. A single TCAM device may be used to support multiple features. With the increasing number of features requiring TCAM support, such as various security and firewall features, deep packet inspection, routing, and tunnel termination features, allowing the sharing of a TCAM space can be a cost effective solution for many designs.

SUMMARY

In one implementation, a network device may include a ternary content addressable memory (TCAM) programmed to include entries representing a plurality of prefix tree data structures used in processing network traffic received by the network device. The network device may also include logic to insert an entry in the TCAM based on a defragmentation operation performed on the TCAM in which a candidate entry that includes a minimum relocation weight is chosen to be relocated as part of the defragmentation operation, where the minimum relocation weight is determined based on trie depths corresponding to entries that occupy the candidate entry before defragmentation.

In another implementation, a method may include receiving a representation of a node that is to be inserted in a prefix tree data structure that is represented in a TCAM; determining whether there is enough space in the TCAM to store the representation of the node; attempting to initially insert the representation of the node in the TCAM when it is determined that there is enough space in the TCAM to store the representation of the node; and defragmenting the TCAM when the initial attempt to insert the representation of the node in the TCAM fails, the defragmentation including locating, based on a candidate entry search that locates the candidate entry according to a minimum relocation weight of the candidate entry, a candidate entry in the TCAM at which to insert the representation of the node, where the relocation weight is determined from trie depths corresponding to entries that occupy the candidate entry before defragmentation.

In yet another implementation, a device may include means for receiving a representation of a node that is to be inserted in a prefix tree data structure that is represented in a TCAM; means for determining whether there is enough space in the TCAM to store the representation of the node; means for attempting to initially insert the representation of the node in the TCAM when it is determined that there is enough space in the TCAM to store the representation of the node; and means for defragmenting the TCAM when the initial attempt to insert the representation of the node in the TCAM fails, the defragmentation including locating, based on a candidate entry search that locates the candidate entry according to a minimum relocation weight of the candidate entry, a candidate entry in the TCAM at which to insert the representation of the node, where the relocation weight is determined from trie depths corresponding to entries that occupy the candidate entry before defragmentation.

BRIEF DESCRIPTION OF THE DRAWINGS

The accompanying drawings, which are incorporated in and constitute a part of this specification, illustrate one or more embodiments described here and, together with the description, explain these embodiments. In the drawings.

DETAILED DESCRIPTION

The following detailed description of the invention refers to the accompanying drawings. The same reference numbers in different drawings may identify the same or similar elements. Also, the following detailed description does not limit the invention.

As described herein, a network device may process network traffic using a TCAM that supports multiple applications. The TCAM entries for different applications may be of different sizes and may be located at arbitrary locations in the TCAM. Advantageously, the entire TCAM may be utilized for a user customizable set of applications.

Exemplary System Overview

Figure 1:
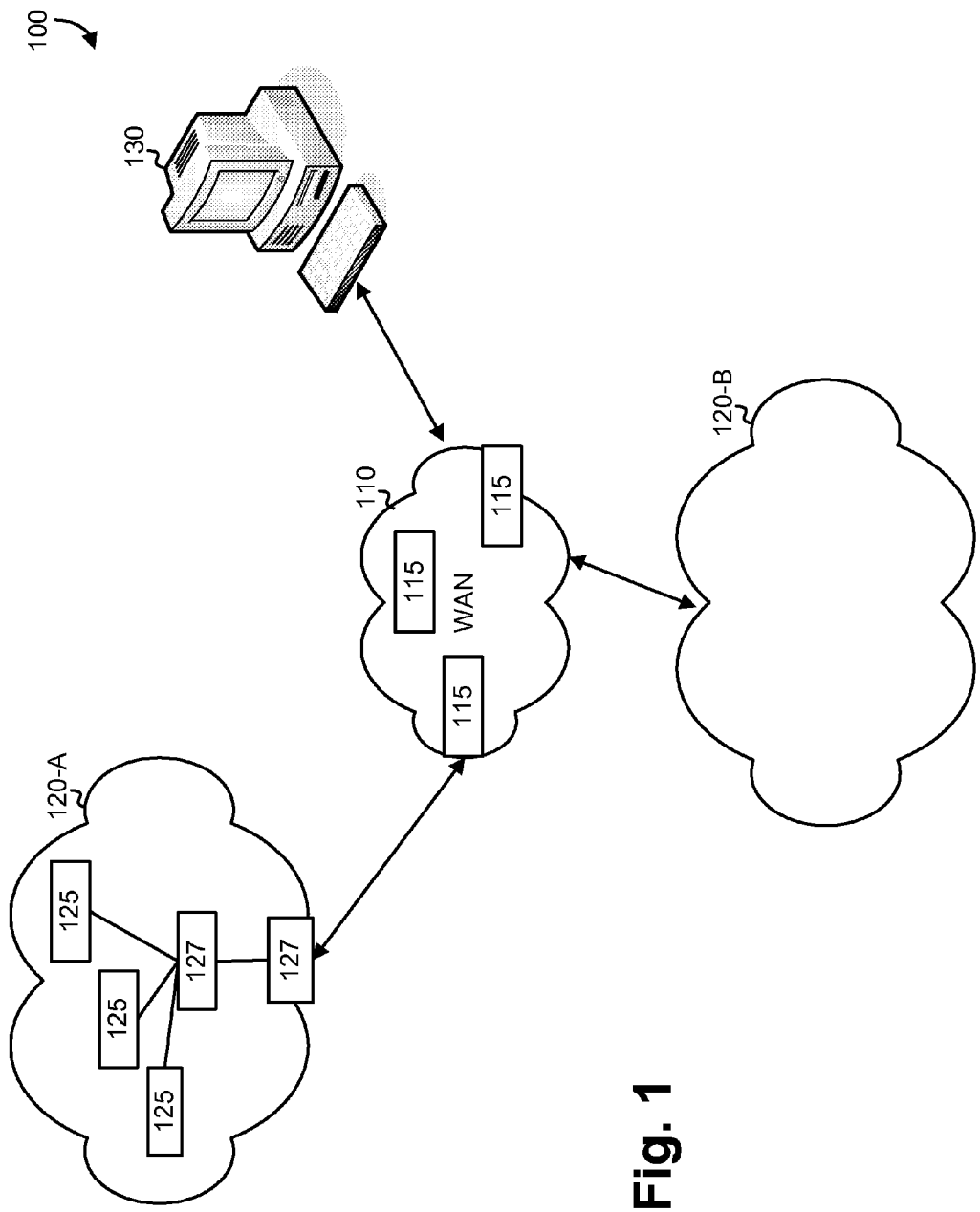
FIG. 1 is a diagram of an exemplary system in which concepts described herein may be implemented.

FIG. 1 is a diagram of an exemplary system 100 in which concepts described herein may be implemented. System 100 may include a wide area network (WAN) 110 connected to one or more private networks 120-A and 120-B (collectively referred to as private networks 120) and a computing device 130. Private networks 120 may each, for example, include corporate or individual local area networks (LANs).

WAN 110 may generally include one or more types of networks. For instance, WAN 110 may include a cellular network, a satellite network, the Internet, or a combination of these networks that that are used to transport data. Although shown as a single element in FIG. 1, WAN 110 may include a number of separate networks that function to provide services to private networks 120 and computing devices, such as computing device 130. WAN 110 may be implemented using a number of network devices 115. Network devices 115 may include, for example, routers, switches, gateways, or other devices that are used to implement WAN 110.

Private networks 120 may each include a number of computing devices, such as, for example, client computing stations 125 and network devices 127. Client computing stations 125 may include computing devices of end-users, such as desktop computers or laptops. Network devices 127, similar to network devices 115, may include network devices used to implement private networks 120, such as firewalls, switches, routers, combinations of these devices, or other devices relating to network implementation, control, and/or security.

Computing device 130 may include, for example, a laptop or personal computer connected to WAN 110. Alternatively, computing device 130 may include a mobile device, such as a cell phone, etc.

In the exemplary system shown in FIG. 1, two private networks 120-A and 120-B and one computing device 130 are shown. In other implementations, system 100 may include additional, fewer, different, or differently arranged networks and/or devices.

Exemplary Device Architecture

Figure 2:
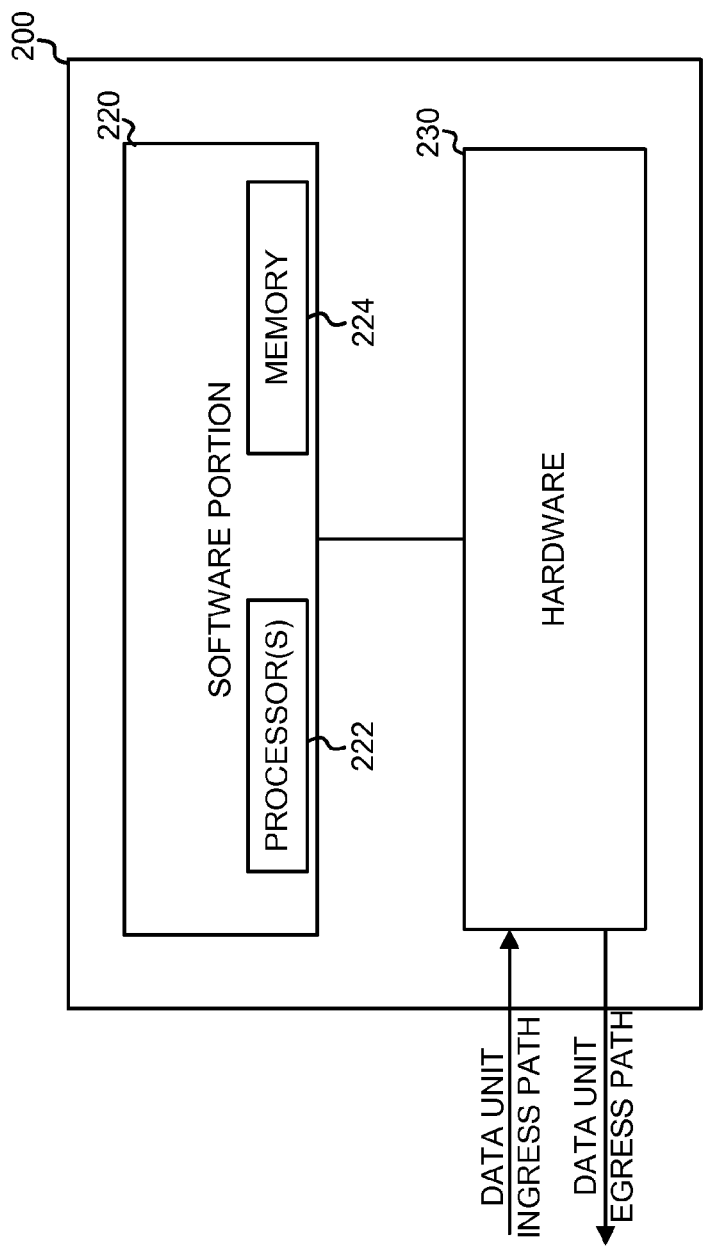
FIG. 2 is a block diagram of an exemplary network device that may correspond to one of the network devices shown in FIG. 1.

FIG. 2 is a block diagram of an exemplary network device 200, which may correspond to one of network devices 115 or 127. In order to increase its throughput, network device 200 may use dedicated hardware to process or assist in processing incoming data units, where a data unit is defined as packet-based or non-packet based information. As shown in FIG. 2, network device 200 may generally include a software portion 220 and a hardware portion 230.

Software portion 220 may include software designed to control network device 200. For example, software portion 220 may control hardware portion 230 and may provide an interface for user configuration of network device 200. In general, software portion 220 may implement the functions of the network device that are not time critical. Software portion 220, although shown as a single abstract block 220 in FIG. 2, may be implemented through, for example, one or more general purpose processors 222 and one or more computer memories 224. Processors 222 may include processors, microprocessors, or other types of processing logic that may interpret and execute instructions. Computer memories 224 (also referred to as computer-readable media herein) may include random access memories (RAMs), read-only memories (ROMs), or other types of dynamic or static storage devices that may store information and instructions for execution by one or more processors 222.

Hardware portion 230 may include circuitry for efficiently processing data units received by network device 200. Hardware portion 230 may include, for example, logic, such as an application specific integrated circuit (ASIC), a field programmable gate array (FPGA), and/or a content-addressable memory (CAM). Hardware portion 230 may, for example, receive incoming data units, extract header information for the data units, and process the data units based on the extracted header information.

Although network device 200 is shown as including a software portion 220 and a hardware portion 230, network device 200 may, in some implementations, be implemented entirely through hardware.

When network device 200 implements a firewall, network device 200 may inspect network traffic passing through network device 200 and may perform actions, such as to deny or permit passage of the traffic based on rules defined for the firewall. To maximize the bandwidth of the firewall, the comparison of the incoming traffic to the firewall rules may be made in hardware portion 230. When network device 200 implements a router or switch, network device 200 may examine header information of incoming data units, make routing or switching decisions based on the header information, and output the data units at an appropriate output port. The routing or switching decisions may be made in hardware portion 230. In some implementations, a single network device 200 may implement functionality of a number of "traditional" network devices, such as a router that also includes firewall functionality.

Hardware portion 230 may particularly include, among other components, a content-addressable memory (CAM). In general, a CAM is a type of memory in which a value (called a key herein) is supplied and the CAM searches its entire memory to see if that data word is stored anywhere in it. If the key is found, the CAM may return the address of the highest ranking hit. One type of CAM, known as a ternary CAM (TCAM) allows a third matching state of "X" or "Don't Care" for one or more bits in the key, thus adding flexibility to the search. For example, a TCAM might have a stored word of "10XX0" which will match any of the four search words "10000", "10010", "10100", or "10110".

Figure 3:
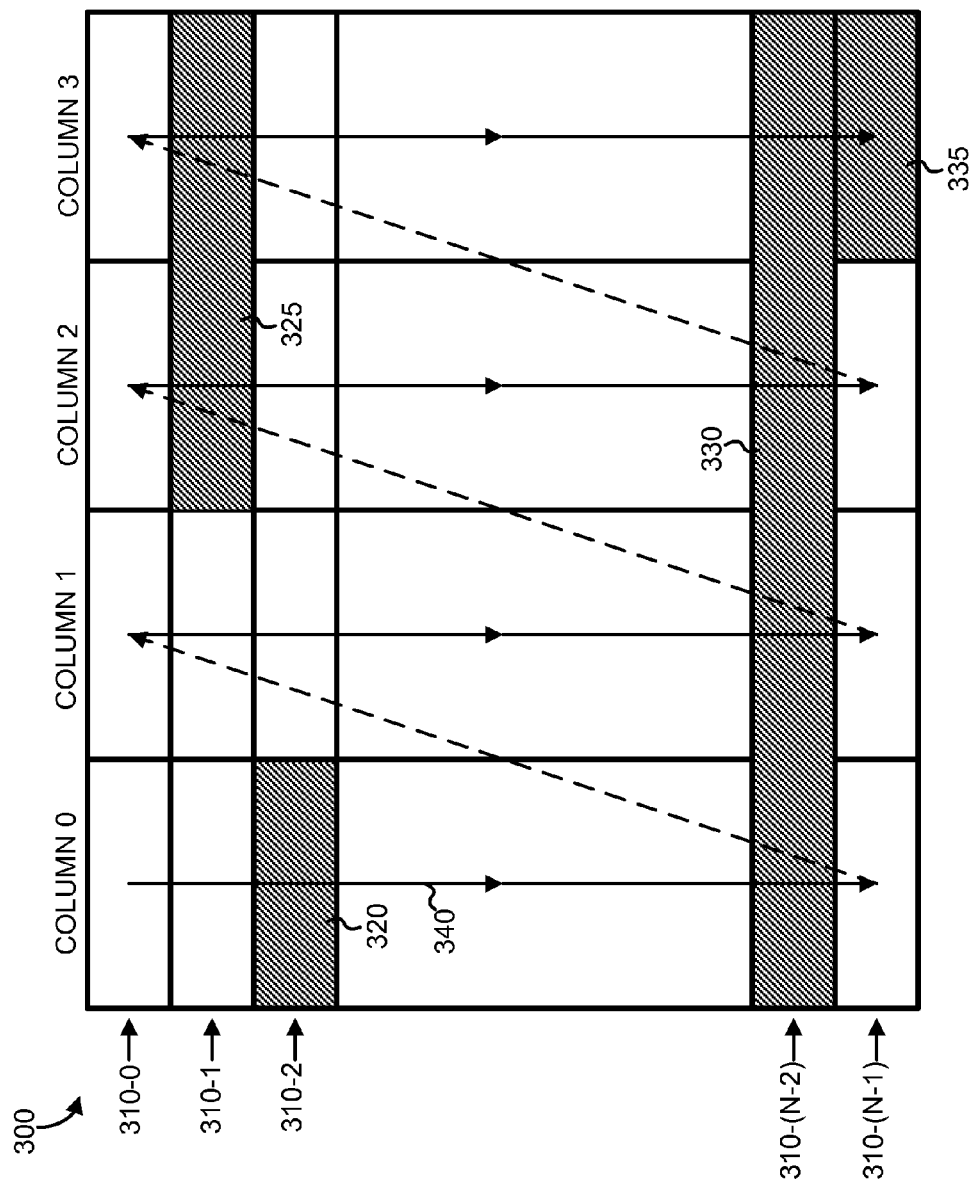
FIG. 3 is a diagram illustrating an exemplary implementation of a TCAM that may be used by the hardware portion of the network device shown in FIG. 2.

FIG. 3 is a diagram illustrating an exemplary implementation of a TCAM 300 that may be used by hardware portion 230 (FIG. 2). TCAM 300 may be conceptualized as including a number of columns (labeled as columns 0 through 3) and a number (N) of rows 310-0 through 310-(N−1). TCAM entries may be stored at each column/row intersection. An exemplary entry 320 is shown at column zero, row two. Entry 320 is one column wide. Each column entry may correspond to, for example, a 32-bit value. In some applications, entries may be multiple-columns wide, such as entry 325, which is two columns wide and entry 330, which is four columns wide. Another one-column entry, entry 335, is also shown in FIG. 3.

Although the TCAM shown in FIG. 3 includes a total of four columns, different TCAM implementations may have more or less than four columns.

In operation, a key input to TCAM 300 may be matched to each entry in TCAM 300, and an indication of the highest ranking match (such as the address of the match) returned by TCAM 300. Which of a number of matches is the "highest ranking" match may depend on the particular implementation of TCAM 300. In the example of FIG. 3, the search ranking order is illustrated by curve 340, in which row zero, column zero is the lowest ranked entry followed by successive entries in column one, followed by column two, and so on through the last entry in column three, which is the highest ranked entry. Thus, for TCAM 300, if each of entries 320, 325, 330, and 335 matched the search key input to TCAM 300, TCAM 300 may return a value indicating entry 335 was a "hit".

In situations in which TCAM 300 is used by network device 200 to implement multiple applications, the TCAM entry for each application may be thought of as a separate set of entries that are to be independently searched in TCAM 300.

Different entry sets may be of different lengths. For example, for IPv4 routing, single column entries may be used (e.g., entries 320 and 335), while for IPv6 routing, four-column entries may be used (e.g., entry 330).

Figure 4:
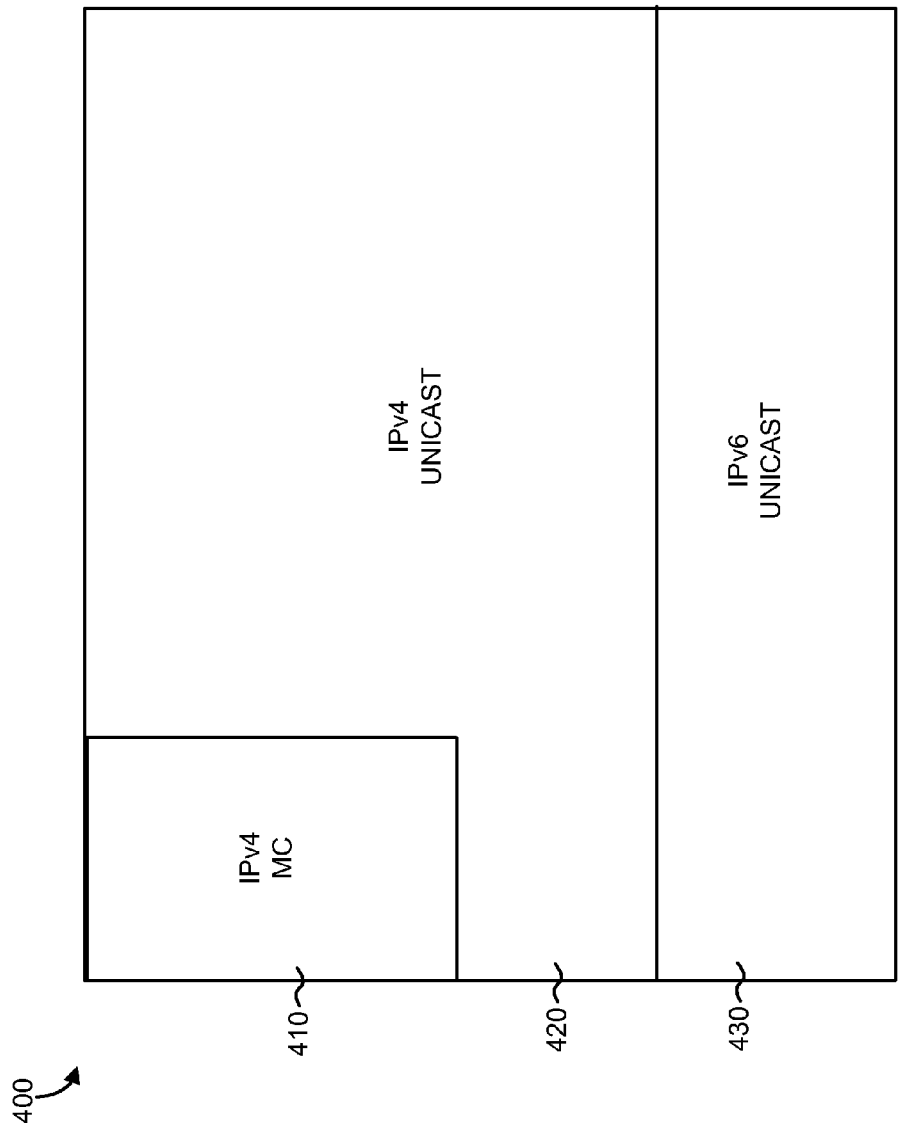
FIG. 4 is a diagram illustrating a TCAM divided into different homogeneous regions.

One known solution to using a TCAM to support multiple applications is to partition the TCAM into multiple homogeneous regions, where each region is dedicated to a particular application. FIG. 4 is a diagram illustrating a TCAM 400 divided into different homogeneous regions. In this example, region 410 is used to support IPv4 multi-cast (MC) data units, region 420 is used to support IPv4 unicast (UC) data units, and region 430 is used to support IPv6 UC data units. IPv4 UC and IPv4 MC entries may each have a "single-quarter" length (i.e., one column wide) while IPv6 UC entries may be "four-quarter" length entries (i.e., each IPv6 UC entry occupies an entire row). Dividing TCAM 400 in this manner, although potentially simple from a software standpoint, may result in an inefficient use of TCAM 400.

Heterogeneous TCAM Support

Consistent with an application described herein, a TCAM, such as TCAM 300, may support multiple applications, each of which may potentially use a different TCAM entry size. The TCAM entries may be heterogeneously organized within the TCAM, in which the entries for different applications may be placed at arbitrary locations in TCAM 300. By writing the entries to TCAM 300 in arbitrary mixed usage combinations, a high utilization of the TCAM may be achieved, even given arbitrary end-user configuration of the applications used by the network device.

Applications using TCAM 300 may use TCAM 300 to perform searches based on a prefix tree ("trie") data structure. A trie is a known tree data structure that may be used to store an associative array. A node's position in the trie corresponds to the key associated with the node. All the descendants of a node may have a common prefix of the key associated with that node, and the root may be associated with the empty key.

Figure 5:
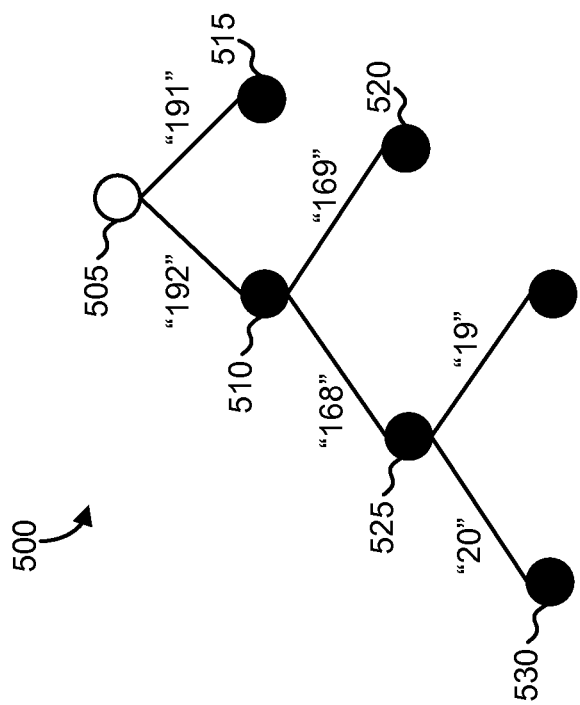
FIG. 5 is a diagram illustrating an exemplary trie used for packet routing.

One application that may particularly use tries is a longest prefix match search algorithm for routing data units in a network. A trie may be used to represent a routing table. FIG. 5 is a diagram illustrating an exemplary trie 500 used for packet routing. As shown for trie 500, node 505 may be the root node. Node 510 may be reached through a match to the key "192" and node 515 may be reached through a match to the key "191". Nodes 520 and 525 may be son nodes of node 510. Node 525 may be reached through a match to the key "192.168". When using trie 500 to implement the longest prefix match algorithm, an IP address may be matched to the deepest matching node in trie 500. For example, the IPv4 address "192.168.20.0" may match to node 530. The IPv4 address "192.168.100.5" may match to node 520 because the longest prefix in this address that can be traversed in trie 500 is "192.168." Each node in trie 500 may be associated with an output port in network device 200.

In terms of TCAM 300, each node in trie 500 may be represented in TCAM 300 as a TCAM entry. The graph relationship of nodes in trie 500 may correspond to a spatial relationship in TCAM 300. More particularly, for each trie, nodes in a trie that are below one another in the trie should be inserted into TCAM 300 at a location in the TCAM that corresponds to the node ranking in the trie. For example, for TCAM 300 in which multiple hits results in the hit corresponding to a later entry in TCAM 300 being returned, nodes from the trie should be written to TCAM 300 such that son nodes are written as entries below the father nodes in TCAM 300. When TCAM 300 is used to support different applications, the trie for each application may be independent of the tries for the other applications.

For heterogeneous applications (e.g., IPv4 unicast, IPv4 multi-cast, and IPv6 unicast) implemented using a single physical TCAM, each application may be represented by a separate trie by network device 200. Additionally, in situations in which network device 200 is a router, the router may implement multiple virtual routers. Each virtual router may be associated with a separate set of independent tries, all of which may be implemented in a single physical TCAM. Depending on the application, a trie node may correspond to different entry lengths within TCAM 300. For example, an entry for a IPv4 routing table may be a "single quarter" entry that occupies one entry space (e.g., entry 320 or entry 335 in FIG. 3) while other applications may use entries that occupy more than one entry space (a "multi-quarter" entry), such as a four-quarter IPv6 entry.

Figure 6:
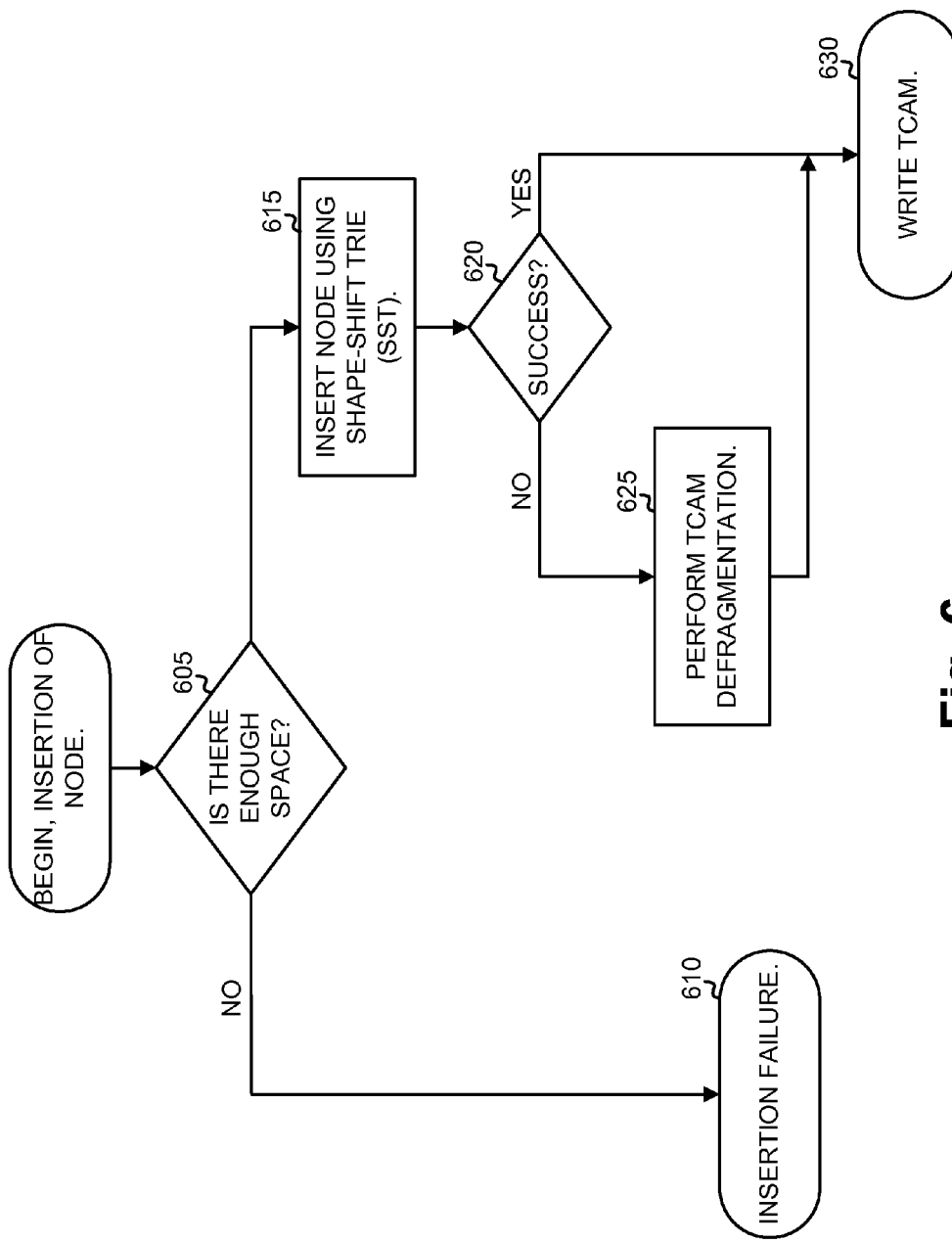
FIG. 6 is a flow chart illustrating exemplary operations for inserting a node within a trie.

At various times, network device 200 may insert a new node within a trie. FIG. 6 is a flowchart illustrating exemplary operations for inserting a node within a trie. Moving or shifting a node in a trie may be considered to be essentially equivalent to an insertion operation.

Network device 200 may initially determine whether there is enough free space in TCAM 300 for the entry that is to be inserted (block 605). If there is not enough free space, such as if a four-quarter entry is to be inserted into TCAM 300 when there are only two single-quarter entries that are free, (block 605—NO), the insertion operation may fail (block 610).

If, however, there is enough space to insert the entry in TCAM 300, network device 200 may attempt to insert the node using the shape-shift trie (SST) technique (block 615).

Figure 7:
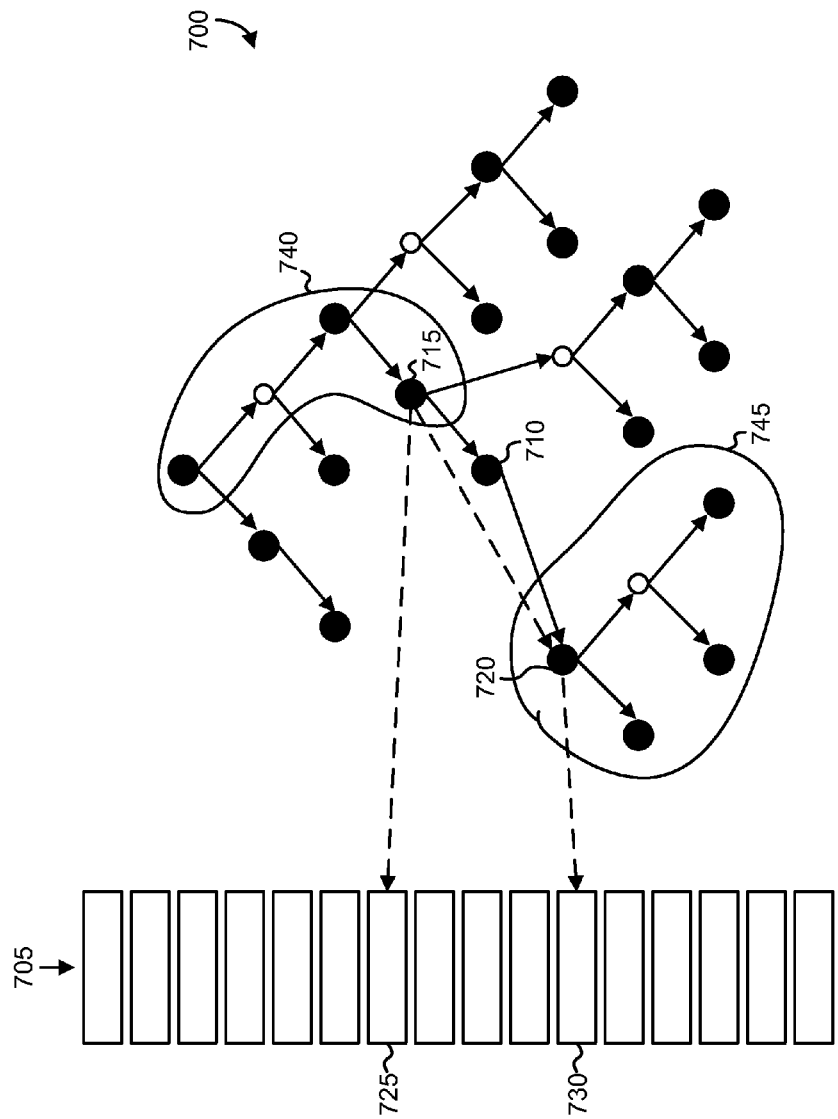
FIG. 7 is a diagram conceptually illustrating the relationship between nodes of a trie and entries in a TCAM.

The SST technique for inserting a node into TCAM 300 will next be described in more detail with reference to FIGS. 7 and 8. FIG. 7 is a diagram conceptually illustrating the relationship between nodes of a trie and entries in a TCAM. A trie 700 is shown in FIG. 7 that includes a number of nodes. Entries in TCAM 300 are illustrated as TCAM entry space 705 and are shown as a column in which entries higher in the column correspond to lower priority entries in TCAM 300. In other words, the top entry in TCAM entry space 705 may correspond to the lowest priority entry and the bottom entry may correspond to the highest priority entry. In trie 700, filled-in nodes in trie 700 may represent nodes associated with actions that need to be written to TCAM 300. To maintain the spatial relationship defined by trie 700, each node in trie 700 may be written as a TCAM entry that is after the TCAM entry corresponding to the father node and before the TCAM entry corresponding to the son node.

Network device 200 may attempt to use the SST technique to write entries to TCAM 300. In general, in the SST technique, a new entry may be directly written to TCAM 300 when there is an empty entry between the father and son nodes that correspond to the new node. Assume, for example, that node 710 is to be added to trie 700. Node 710 has a father node 715 and a son node 720. Further, assume that father node 715 is stored in entry 725 of TCAM entry space 705 and son node 720 is stored in entry 730 of TCAM entry space 705. In this situation, new node 710 can be written to an entry between entries 725 and 730. In some situations, there may not be any available entries 705 that are within the allowed range of entries. For example, for node 710, assume that each of the entries between entry 725 and 730 are filled, either by other nodes in trie 700, or by other nodes in other tries. In this case, using the SST technique, network device 200 may attempt to "push" the father trie or son trie up or down in entries 705. The SST technique will now be explained in more detail with reference to FIG. 8.

Figure 8:
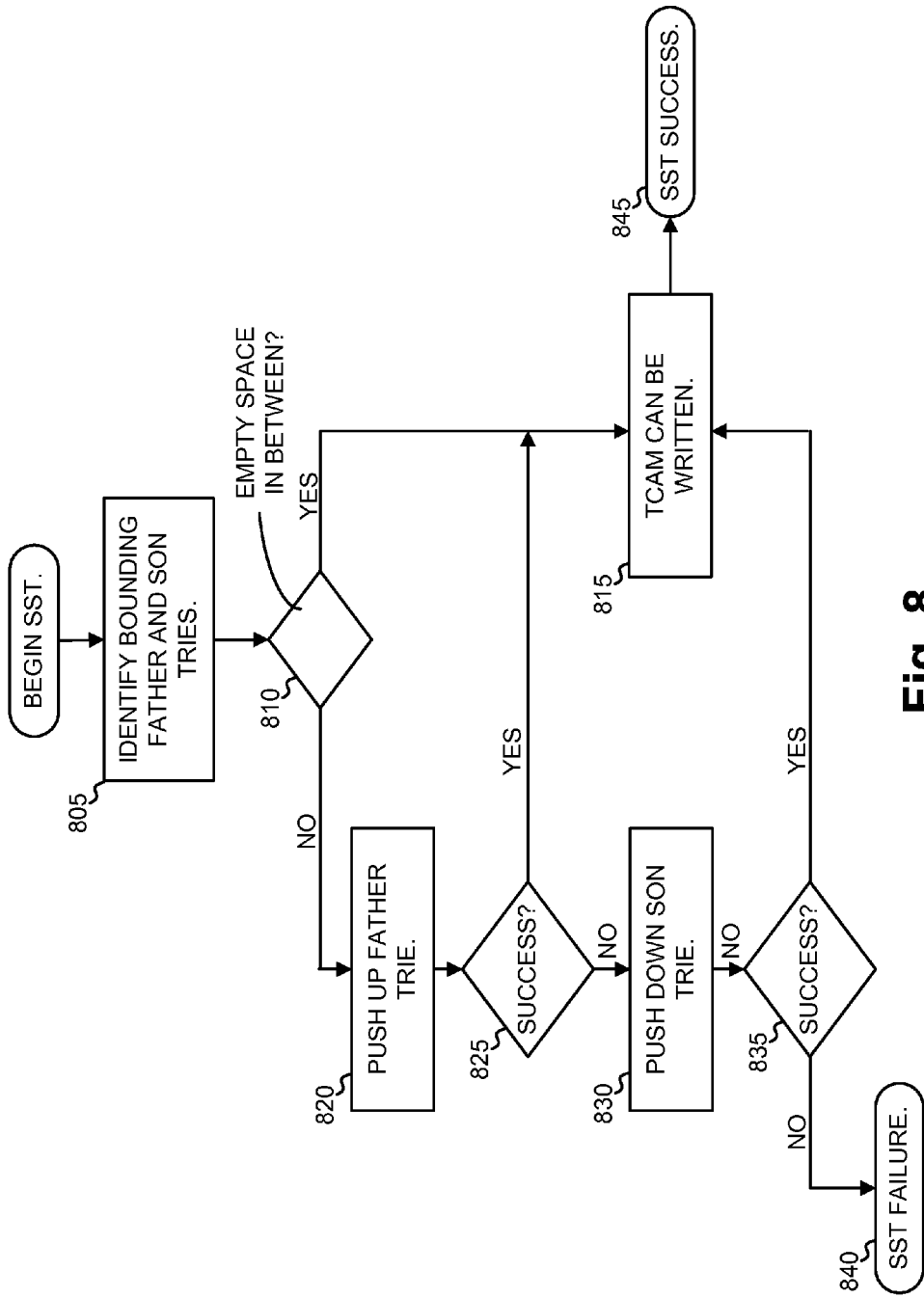
FIG. 8 is a flow chart illustrating exemplary operations for performing the shape-shift trie technique.

FIG. 8 is a flow chart illustrating exemplary operations for performing the SST technique, as performed in block 615 (FIG. 6). Network device 200 may identify the bounding father trie and bounding son trie for the node (block 805). The bounding father trie may be defined as the subset of trie 700 that includes the father node and nodes directly above the father node in the trie. In trie 700, for example, the bounding father trie is illustrated by enclosure 740. The bounding son trie may be defined as all the son node(s) and descendent nodes. In trie 700, for example, the bounding son trie is illustrated by enclosure 745.

Network device 200 may next determine if there is an empty space large enough to hold the new entry in between the father node and the son node (block 810). If yes, the new entry can be directly inserted into trie 700 and the entry may be marked as writeable to the empty TCAM entry (block 815). If the result of block 810 is NO (i.e., there is no empty space between the father and son node), network device 200 may attempt to "push" the father trie up in the TCAM (block 820). That is, entries corresponding to nodes in the father trie may be written to empty spaces farther up in TCAM entry space 705. For instance, one or more of the nodes in father trie 740 may be moved, subject to the constraint that the relative order in father trie 740 is preserved.

If the result of block 820 is successful (i.e., enough empty spaces were located above the father node in order to shift the father trie), the TCAM can be written to reflect the pushed father trie and the newly inserted node (block 825—YES and block 815). If the result of block 820 is not successful (i.e., not enough empty spaces were located above the father node in order to shift the father trie), network device 200 may attempt to push down the son trie (block 830). That is, entries corresponding to nodes in the son trie may be written to empty spaces farther down in TCAM entry space 705. For instance, one or more of the nodes in son trie 745 may be moved, subject to the constraint that the relative order in son trie 745 is preserved. If the result of block 830 is successful (i.e., enough empty spaces were located below the son node in order to shift the son trie), the TCAM may be written to reflect the pushed son trie and the newly inserted node (block 835—YES and block 815). Otherwise, network device 200 may determine that the result of the SST technique is a failure (block 835—NO and block 840). In cases in which the TCAM can be written to reflect the inserted node, network device 200 may determine that the result of the SST technique is a success (block 845).

Referring back to FIG. 6, if the SST technique was a success, the new entry and any other entries modified by the SST technique may be written to TCAM 300 (block 620—YES, and block 630).

If the result of the SST technique is not a success (block 620—NO), the entry can not be directly written to TCAM 300. In this case, a TCAM defragmentation operation may be performed (block 625). The defragmentation may generally operate to free space in TCAM 300 by shifting other TCAM entries. The shifted TCAM entries may be entries from both the trie of the entry that is to be inserted and from other tries.

Figure 9:
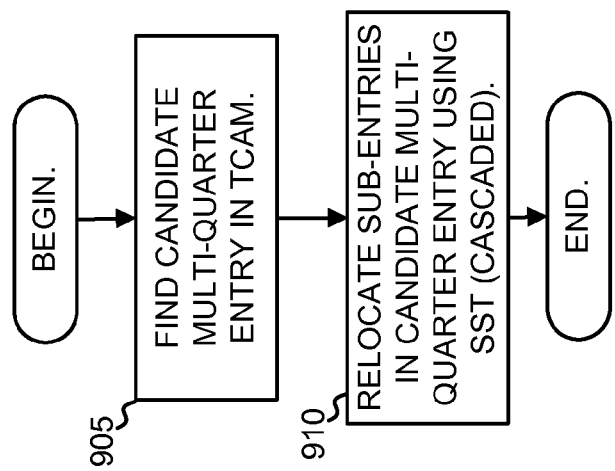
FIG. 9 is a flow chart illustrating exemplary operations for performing a defragmentation operation.

FIG. 9 is a flow chart illustrating exemplary operations for performing a defragmentation operation, as performed in block 625 (FIG. 6). The defragmentation operation may begin by finding a candidate multi-quarter entry in TCAM 700 (block 905). The candidate entry may be an entry that matches the size of the new entry that is to be inserted into the TCAM. The candidate may be an entry that is likely to be a "good" candidate, where a good candidate is one that requires relatively few writes to TCAM 700. A candidate may be chosen, for example, as a TCAM row that is between the father entry and the son entry and that has the least number of occupied entries.

Figure 10:
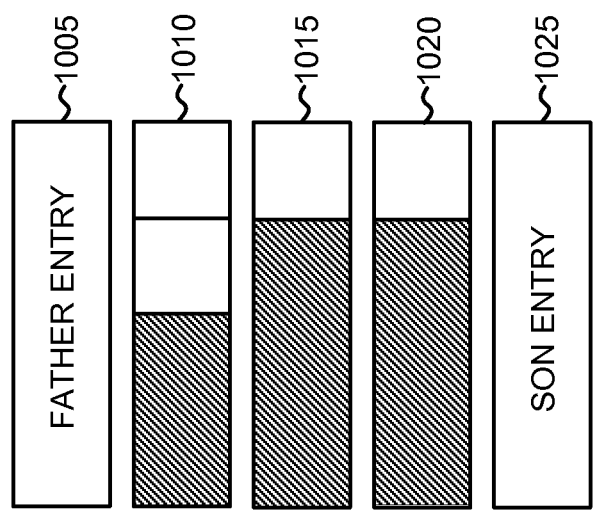
FIG. 10 is a diagram illustrating choosing of a candidate multi-quarter entry in a TCAM.

FIG. 10 is a diagram illustrating choosing of a candidate multi-quarter entry in a TCAM. In this example, assume that the node that is to be inserted into TCAM 300 is a four-quarter TCAM entry (i.e., an entire row of TCAM 300). Five exemplary rows are shown in FIG. 10, labeled as rows 1005, 1010, 1015, 1020, and 1025. Assume row 1005 stores the entry corresponding to the father node and node 1025 stores the entry corresponding to the son node. Row 1010 stores a two-quarter entry. Rows 1020 and 1030 each store a three-quarter entry. Because the candidate entry for insertion is a four-quarter entry, an entire row needs to be used. In this example, the entry in row 1010 may be initially chosen as a candidate multi-quarter entry because it includes the fewest number of occupied entries among rows 1010, 1015, and 1020.

Referring back to FIG. 9, network device 200 may relocate sub-entries in the candidate multi-quarter entry (block 910). Referring back to the example of FIG. 10, network device 200 may attempt to relocate all of the entries (i.e., the sub-entries) in row 1010. The relocation operation for each of the entries that are in the candidate multi-quarter entry in TCAM 300 may be performed in a cascaded manner, in which blocks 615, 620, and 625 (FIG. 6) are performed for each sub-entry that is to be relocated. Each execution of blocks 615, 620, and 625 may be performed using the trie corresponding to the entry that is being relocated. In the example of FIG. 10, network device 200 may use the SST technique on the entry in row 1010 (block 615) to attempt to move this entry. If this is not successful, network device 200 may implement defragmentation based on this entry to attempt to move the entry. For some candidate multi-quarter entries located in block 905, multiple sub-entries may need to be relocated. In this situation, relocation may be performed for each of the entries that need to be relocated. As a result of the cascaded defragmentation, a number of entries, potentially corresponding to different tries, may eventually be moved in TCAM 300 by writing the entries to the relocated entry positions (block 630).

Search Technique for Finding Candidate
Multi-Quarter Entry in the TCAM

In the discussion above describing the defragmentation operation, location of a candidate multi-quarter entry was discussed with respect to the operation of block 905 (FIG. 9). The candidate multi-quarter entry chosen from TCAM 700 may be an entry that matches the size of the new entry that is to be inserted into the TCAM. Ideally, the candidate may be an entry that is likely to be a "good" candidate, where a good candidate is one that may require relatively few writes to TCAM 700.

One particular technique for selecting a good candidate will now be discussed with reference to FIGS. 11-14. In general, the technique shown in FIGS. 11-14 may search a bounded portion of TCAM 300 to find a good candidate.

Figure 11:
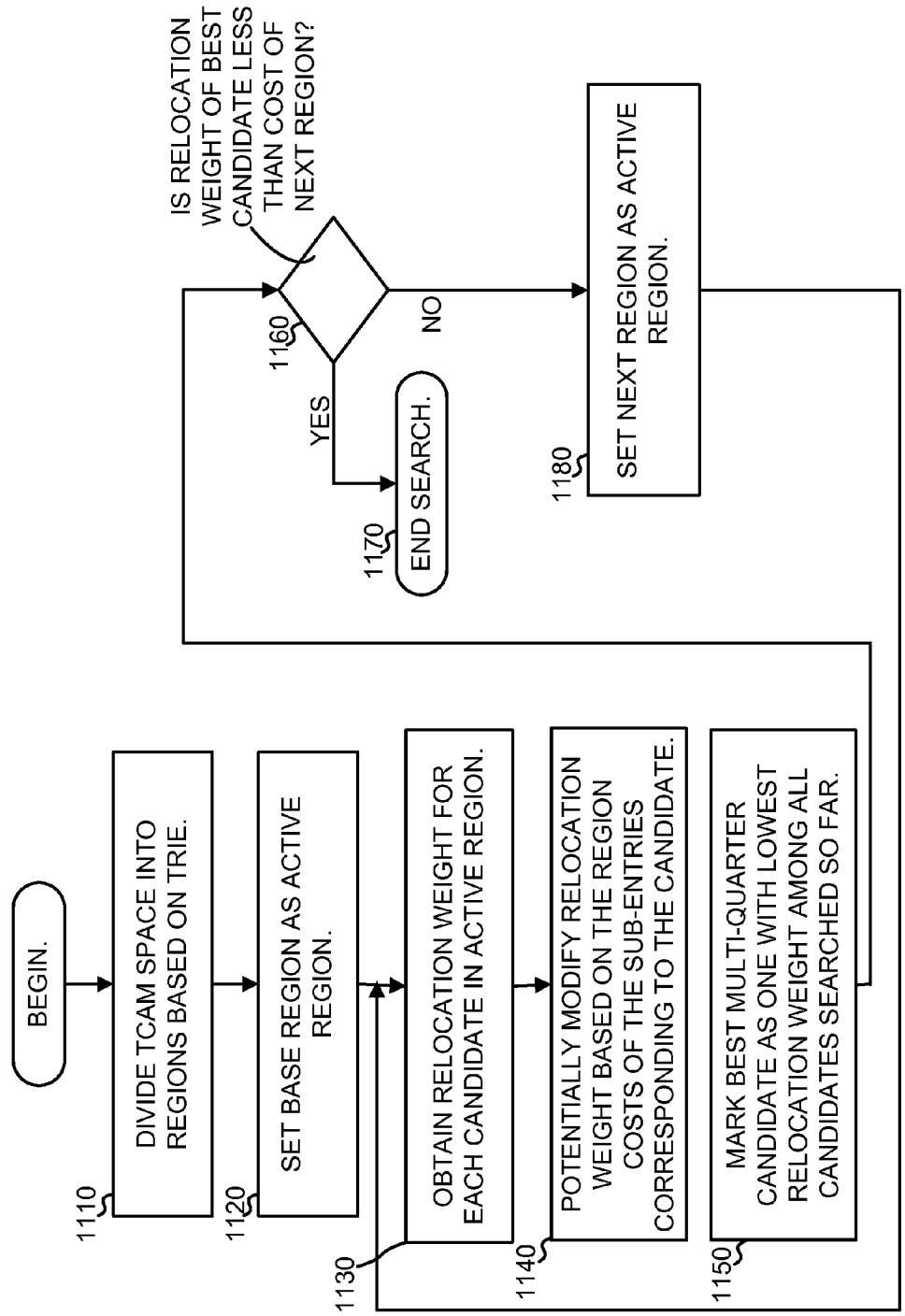
FIG. 11 is a flow chart illustrating exemplary operations for selecting a good defragmentation candidate.

FIG. 11 is a flow chart illustrating exemplary operations for selecting a good defragmentation candidate. To begin, the TCAM space may be divided into regions based on a trie of a node that is currently being inserted (block 1110). The regions may be defined by the levels in the bounding father trie and the bounding son trie for the node that is being inserted.

Figure 12:
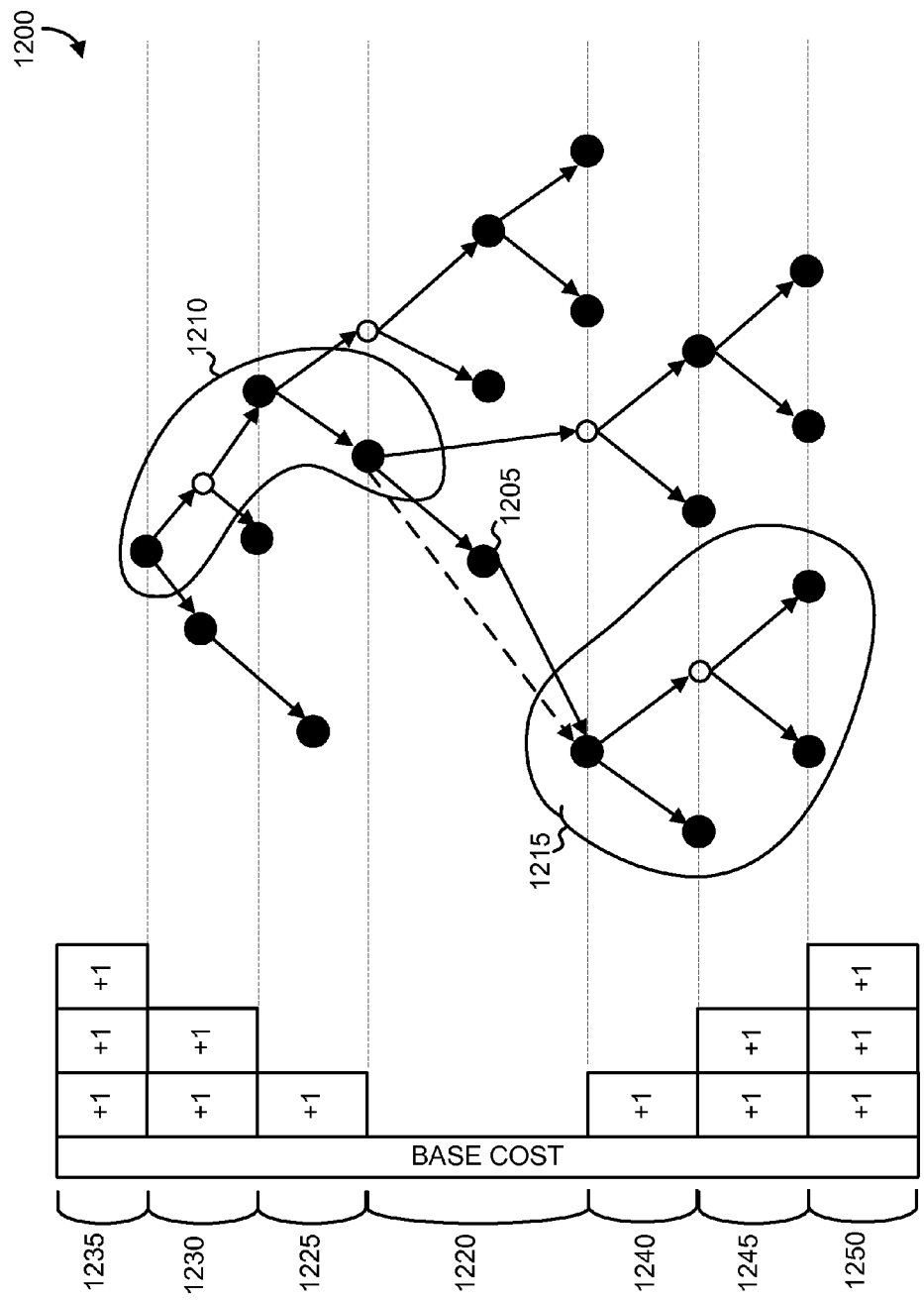
FIG. 12 is a diagram illustrating an exemplary trie.

FIG. 12 is a diagram illustrating an exemplary trie 1200. Assume that node 1205 is the node that is being inserted, enclosure 1210 represents the bounding father trie and enclosure 1215 represents the bounding son trie. Corresponding regions are illustrated in TCAM 300 by dashed lines. In particular, base region 1220 may be defined as the region between the beginning of bounding father trie 1210 and bounding son trie 1215. Regions successively above base region 1220, corresponding to successively higher nodes in father trie 1210, may define the boundaries for regions 1225, 1230, and 1235. Similarly, regions successively below base region 1220, corresponding to successively lower nodes in son trie 1215, may define the boundaries for regions 1240, 1245, and 1250. The "regions" shown in FIG. 1200 may be logical regions that are maintained by network device 200 but may not be physically defined within TCAM 300.

The different regions in trie 1200 may be associated with different region costs that define the inherent additional minimum cost required to relocate a node to a region. For example, for region 1225, to insert node 1205 into this region, at least one node, the father of node 1205, must be moved. The region cost for region 1225 may thus be set at one. The region cost for region 1220 (the base region) may be zero as there is no "additional" cost to insert node 1205 into this region. Similarly, the region cost for region 1230 may be two, and the region cost for region 1235 may be three. Similar region costs are shown for son trie 1215.

Referring back to FIG. 11, a base region may be set as an initial active region for a best candidate search (block 1120). For each candidate multi-quarter entry in TCAM 300 within the active region, network device 200 may obtain a relocation weight for a candidate multi-quarter entry (block 1130). The relocation weight may be a value that estimates the maximum number of TCAM insertions required to relocate the candidate multi-quarter entry. In one particular implementation, the relocation weight may be calculated by network device 200 as the sum of the "trie-weights" corresponding to each sub-entry for the multi-quarter entry, where each trie-weight may be defined as the depth of the corresponding trie.

Figure 13:
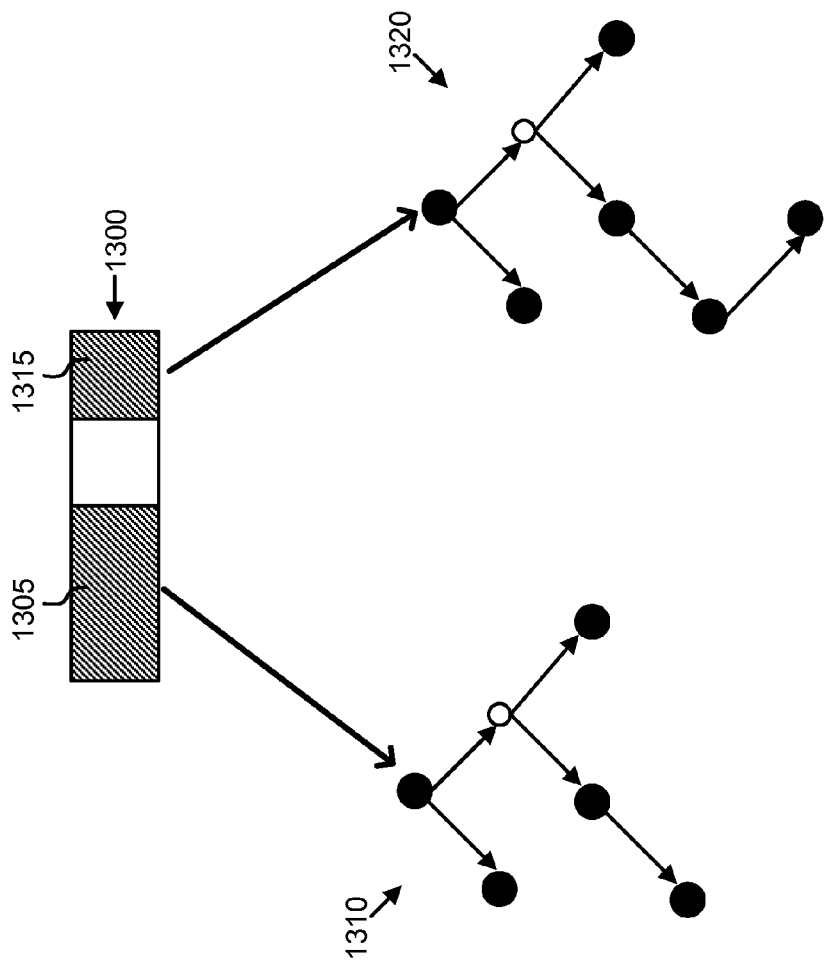
FIG. 13 is a diagram illustrating a determination of an exemplary relocation weight for a candidate multi-quarter entry.

FIG. 13 is a diagram illustrating determination of an exemplary relocation weight for a candidate multi-quarter entry. As an example of obtaining the relocation weight for a multi-quarter entry, consider candidate entry 1300 in FIG. 13. In this example, assume that the multi-quarter entry that is to be inserted is a four-quarter entry (i.e., an entire line). Candidate entry 1300 may include a two-quarter entry 1305 that corresponds to a node in trie 1310. Candidate entry 1300 may also include a one-quarter entry 1315 that corresponds to a node in trie 1320. Trie 1310 has a depth of three and trie 1320 has a depth of four. The relocation weight for candidate entry 1300 may thus be calculated as seven, the depth of trie 1310 plus the depth of trie 1320.

Referring back to FIG. 11, relocation weights for each candidate entry obtained in block 1130 may be additionally modified to account for a region cost of the sub-entries corresponding to the candidate (block 1140). In one implementation, the region cost may be added to the relocation weight of the candidate entry. In the example of FIGS. 12 and 13, for instance, assume node 1205 is to be inserted in trie 1200 and entry 1300 is an entry candidate that is in region 1220. For region 1220, the region cost is zero, which may leave the relocation weight unchanged. For region 1225, however, the region's base cost is one. In the case in which entry 1300 is in region 1225, the relocation weight of entry 1300 may be increased by one, resulting in a total relocation weight of eight. Similarly, for region 1230, the region's base cost is two. In this case, the relocation weight of entry 1300 may be increased by two, resulting in a total relocation weight of nine. In other implementations, the region costs may be included in the total relocation weight of a candidate entry using techniques other than simply adding a value.

In many hardware (e.g., silicon) implementations, the size of a target entry may have only slight impact on the time (or cost) of writing such an entry to TCAM 300 due to the fact that the overhead of starting a write operation is significantly longer that the actual transfer of the entry record. In the above illustration, the same weight of one was assigned to the writing of entries of different sizes (e.g. a single quarter entry versus a two-quarter entry). Although this may be good enough for reflecting the relative cost of writing entries with different sizes, in some implementations, different sized entries may be assigned different weights based on the relative write cost according to their actual hardware implementation.

Referring back to FIG. 11, the candidate entry with the lowest relocation weight may be marked as a best candidate entry by network device 200 (block 1150). If the relocation weight of the best candidate entry is below the region cost of the next region, the search for the best candidate entry may end (block 1160—YES and block 1170). In this case, network device 200 may continue with the defragmentation operation shown in FIG. 9 with the candidate entry marked as the best candidate entry.

If, however, the result of block 1160 is NO, the next region or pair of regions (such as region pairs 1225, 1240; 1230, 1245; or 1235, 1250) may be set as the active region (block 1180).

By stopping the search when the relocation weight of the best candidate is below the region cost of the next candidate, the candidate search technique includes an automatic search ceiling that can potentially reduce the search effort, by an order of magnitude, by limiting the search to a portion of the total possible search space.

For some sub-entries, the relocation weights obtained in block 1130 based on the depth of the trie may not be an optimal technique for estimating the relocation cost of the sub-entry. For instance, because of the way protocols for source specific multicast (SSM) applications are implemented, SSM may use more than one trie. When modifying a node in an SSM trie, an SSM "source" trie may also need to be modified to reflect the new location of the SSM trie node.

Figure 14:
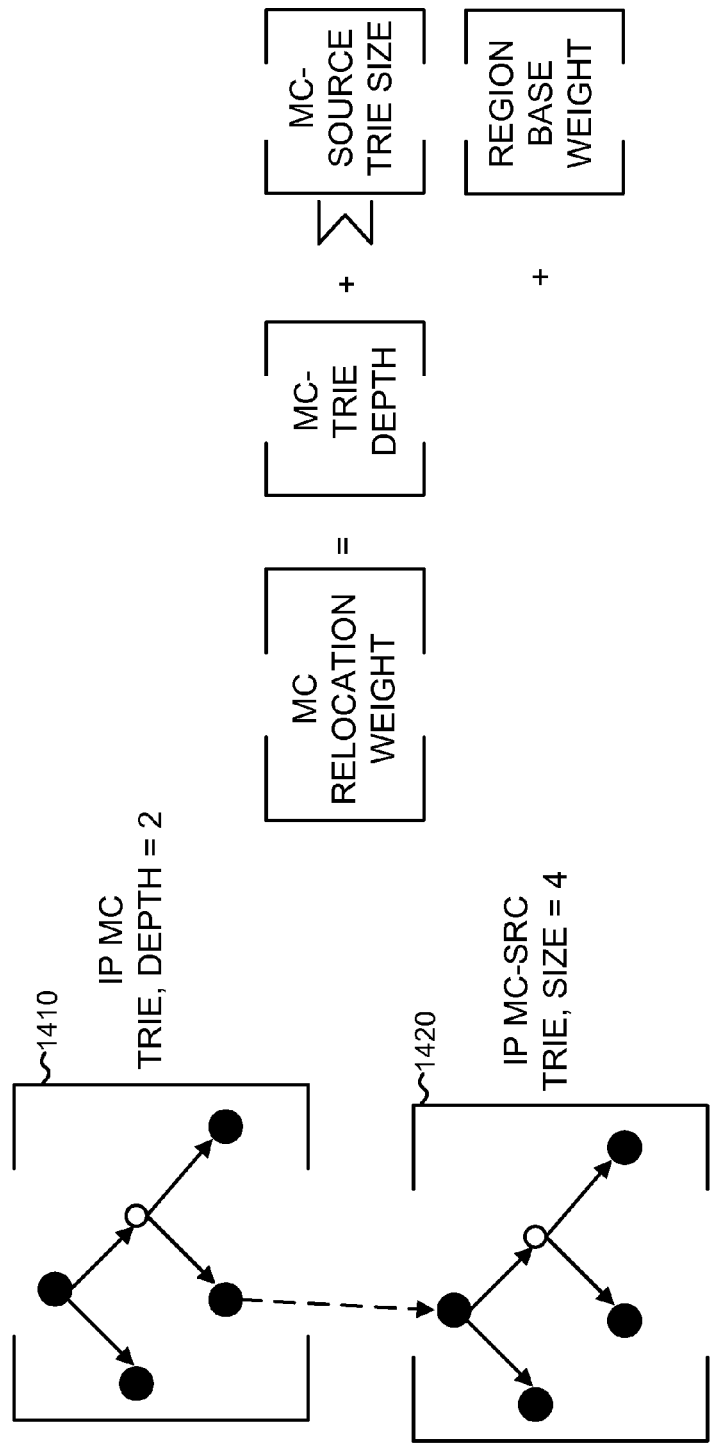
FIG. 14 is a diagram conceptually illustrating obtaining a relocation weight in the case of a source specific multicast relocation.

FIG. 14 is a diagram conceptually illustrating obtaining a relocation weight in the case of SSM multicast relocation. Assume that for an SSM multicast relocation, trie 1410 corresponds to a trie of a TCAM sub-entry. The relocation weight of trie 1410, as previously discussed, may be obtained as the depth of trie 1410, which is two. Because trie 1410 corresponds to a SSM MC trie, however, one or more multicast-source (MC-SRC) tries may also need to be modified. For example, trie 1420 may also need to be modified. Consistent with aspects described herein, the relocation weight for trie 1420 may be obtained as the size of the trie, where the size of the trie is defined as the number of non-virtual nodes in the trie. For trie 1420, the size of the trie is four, as there are four non-virtual nodes in this trie. A "virtual" node in a trie may refer to a node that is not associated with an entry in TCAM 300 and are indicated in FIG. 14 as the nodes that are not filled.

The total relocation weight for the multicast sub-entry may be obtained by network device 200 as the sum of the trie depth, the sum of the sizes of the multicast source tries, and the base weight of the region. For the example shown in FIG. 14, in which the depth of trie 1410 is two, the size of trie 1420 is four, and the region base weight is one, the relocation weight may thus be seven.

CONCLUSION

As described above, through TCAM defragmentation in conjunction with SST-based trie insertion, a TCAM can support a number of application tries in which the entries in the tries are heterogeneously stored in the TCAM. A search technique was also disclosed for finding good candidates when performing the TCAM defragmentation operation. The search technique may progressively search the TCAM space using until a search cost ceiling is reached, allowing good defragmentation candidates to be located without having to search the entire TCAM space.

The foregoing description of implementations provides illustration and description, but is not intended to be exhaustive or to limit the invention to the precise form disclosed. Modifications and variations are possible in light of the above teachings or may be acquired from practice of the invention.

For example, while series of acts have been described with regard to FIGS. 6, 8, 9, and 11, the order of the acts may be varied in other implementations consistent with the invention. Moreover, non-dependent acts may be implemented in parallel.

It will also be apparent that aspects described herein may be implemented in many different forms of software, firmware, and hardware in the implementations illustrated in the figures. The actual software code or specialized control hardware used to implement aspects described herein is not intended to limit the scope of the invention. Thus, the operation and behavior of the aspects were described without reference to the specific software code—it being understood that software and control hardware can be designed to implement the aspects based on the description herein.

Further, certain aspects described herein may be implemented as "logic" or as a "component" that performs one or more functions. This logic or component may include hardware, such as an application specific integrated circuit or a field programmable gate array, or a combination of hardware and software.

Even though particular combinations of features are recited in the claims and/or disclosed in the specification, these combinations are not intended to limit the disclosure of the invention. In fact, many of these features may be combined in ways not specifically recited in the claims and/or disclosed in the specification. Although each dependent claim listed below may directly depend on only one other claim, the disclosure of the invention includes each dependent claim in combination with every other claim in the claim set.

No element, act, or instruction used in the description of the invention should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A network device comprising:
   a ternary content addressable memory (TCAM) programmed to include entries representing a plurality of prefix tree (trie) data structures used in processing network traffic received by the network device;
   logic to determine a first entry for insertion in the TCAM;
   logic to determine a first location of a second stored entry and a first location of a third stored entry;
   logic to determine if an empty space exists between the second stored entry and the third stored entry;
   logic to insert the first entry in the TCAM when the empty space exists;
   logic to push, when the empty space does not exist, the second stored entry from the first location of the second stored entry to a second location;
   logic to insert the first entry in the TCAM, based on pushing the second stored entry from the first location of the second stored entry to the second location and when the empty space exists after pushing the second stored entry;
   logic to push, when the empty space does not exist after pushing the second stored entry, the third stored entry from the first location of the third stored entry to a third location;
   logic to insert the first entry in the TCAM, based on pushing the third stored entry from the first location of the third stored entry to the third location and when the empty space exists after pushing the third stored entry; and
   logic to insert the first entry in the TCAM, when the empty space does not exist after pushing the third stored entry, based on a defragmentation operation performed on the TCAM in which a candidate entry having a relocation weight is chosen to be relocated as part of the defragmentation operation, the relocation weight being determined based on trie depths corresponding to entries that occupy the candidate entry before defragmentation.

2. The network device of claim 1, where the trie data structures store data to implement longest prefix match searches.

3. The network device of claim 1, where the network device performs routing or firewall functions.

4. The network device of claim 1, further comprising:
   logic to determine the relocation weight corresponding to the candidate entry as a sum of relocation weights corresponding to the entries that occupy the candidate entry before defragmentation.

5. The network device of claim 4, further comprising:
   logic to modify the determined relocation weight of the candidate entry based on a region of the candidate entry within the TCAM.

6. The network device of claim 5, where different regions within the TCAM are defined by nodes in a bounding father trie and a bounding son trie corresponding to the entry that is to be inserted.

7. The network device of claim 5, where regions farther away from the entry that is to be inserted are assigned higher region costs and where the logic to insert the entry in the TCAM further includes:
   logic to stop a candidate entry search when a region cost associated with the candidate entry is greater than a threshold.

8. The network device of claim 7, where the threshold is determined based on the relocation weight of the candidate entry with the lowest determined relocation weight.

9. The network device of claim 1, where the TCAM includes:
   a plurality of rows and a plurality of columns, where each of the entries occupies one or more columns of a particular one of the plurality of rows of the TCAM.

10. The network device of claim 1, where the plurality of trie data structures represent data structures for different applications implemented by the network device.

11. The network device of claim 10, where the entries representing the plurality of trie data structures are heterogeneously stored in the TCAM.

12. The network device of claim 1, further comprising:

logic to determine, when processing source specific multicast (SSM) applications, the relocation weight based on trie sizes corresponding to entries that occupy the candidate entry before defragmentation.

13. A method comprising:

receiving, by a device, a representation of a node for insertion in a prefix tree (trie) data structure that is represented in a ternary content addressable memory (TCAM);

determining, by the device, a first location of a second stored entry and a first location of a third stored entry;

determining, by the device, if an empty space exists between the second stored entry and the third stored entry;

inserting, by the device, the representation of the node in the TCAM when the empty space exists;

pushing, by the device and when the empty space does not exist, the second stored entry from the first location of the second stored entry to a second location;

inserting, by the device, the representation of the node in the TCAM, based on pushing the second stored entry from the first location of the second stored entry to the second location and when the empty space exists after pushing the second stored entry;

pushing, by the device and when the empty space does not exist after pushing the second stored entry, the third stored entry from the first location of the third stored entry to a third location;

inserting, by the device, the representation of the node in the TCAM, based on pushing the third stored entry from the first location of the third stored entry to the third location and when the empty space exists after pushing the third stored entry; and inserting, by the device, the representation of the node in the TCAM, when the empty space does not exist after pushing the third stored entry, based on defragmenting the TCAM, the defragmentation including locating, based on a candidate entry search that locates a candidate entry according to a minimum relocation weight of the candidate entry, a particular candidate entry in the TCAM at which to insert the representation of the node, the relocation weight being determined from trie depths corresponding to entries that occupy the particular candidate entry before defragmentation.

14. The method of claim 13, where the trie data structure stores data to implement longest prefix match searches.

15. The method of claim 13, where the method is performed for a plurality of trie data structures that each correspond to a different application relating to network traffic processing.

16. The method of claim 15, where the applications relating to the network traffic processing include network firewall applications or routing applications.

17. The method of claim 13, further comprising:

determining a relocation weight corresponding to the candidate entry as a sum of the relocation weights corresponding to the entries that occupy the candidate entry before defragmentation.

18. The method of claim 17, further including:

modifying the determined relocation weight of the candidate entry based on a region of the candidate entry within the TCAM.

19. The method of claim 18, where different regions within the TCAM are defined by nodes in a bounding father trie and bounding son trie corresponding to the node that is to be inserted.

20. The method of claim 19, where regions farther away from the entry that is to be inserted are assigned higher region costs and where the candidate entry search is stopped when a region cost associated with the candidate entry is greater than a threshold.

21. The method of claim 20, where the threshold is determined based on the relocation weight of the candidate entry with the lowest determined relocation weight.

22. The method of claim 13, further including:

determining, when processing source specific multicast (SSM) applications, the relocation weight based on trie sizes corresponding to the entries that occupy the candidate entry before defragmentation.

23. A device comprising a processor to:

receive a representation of a node that is to be inserted in a prefix tree (trie) data structure that is represented in a ternary content addressable memory (TCAM);

determine a first location of a second stored entry and a first location of a third stored entry;

determine if an empty space exists between the second stored entry and the third stored entry;

insert the representation of the node in the TCAM when the empty space exists;

push, when the empty space does not exist, the second stored entry from the first location of the second stored entry to a second location;

insert the representation of the node in the TCAM, based on pushing the second stored entry from the first location of the second stored entry to the second location and when the empty space exists after pushing the second stored entry;

push, when the empty space does not exist after pushing the second stored entry, the third stored entry from the first location of the third stored entry to a third location;

insert the representation of the node in the TCAM, based on pushing the third stored entry from the first location of the third stored entry to the third location and when the empty space exists after pushing the third stored entry; and insert the representation of the node in the TCAM, if the empty space does not exist after pushing the third stored entry based on defragmenting the TCAM, the defragmentation including locating, based on a candidate entry search that locates the candidate entry according to a minimum relocation weight of the candidate entry, a candidate entry in the TCAM at which to insert the representation of the node, the relocation weight being determined from trie depths corresponding to entries that occupy the candidate entry before defragmentation.

* * * * *